(12) United States Patent
Andoh

(10) Patent No.: US 6,259,749 B1
(45) Date of Patent: Jul. 10, 2001

(54) VITERBI DECODER WITH PIPELINED ACS CIRCUITS

(75) Inventor: Takeshi Andoh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/939,911

(22) Filed: Sep. 29, 1997

(30) Foreign Application Priority Data

Sep. 27, 1996 (JP) .................................... 8-256207

(51) Int. Cl.$^7$ ...................................... H03D 1/00
(52) U.S. Cl. ............................ 375/341; 714/795
(58) Field of Search ...................... 375/341, 260, 375/262, 265; 714/746, 791, 794, 795, 796

(56) References Cited

U.S. PATENT DOCUMENTS 4,614,933  9/1986  Yamashita et al. .................. 340/347

FOREIGN PATENT DOCUMENTS

| 60-173930 | 9/1985 | (JP) . |
| 60-199240 | 10/1985 | (JP) . |
| 1-295533 | 11/1989 | (JP) . |
| 8-340262 | 12/1996 | (JP) . |
| 9-148943 | 6/1997 | (JP) . |

*Primary Examiner*—Chi Pham
*Assistant Examiner*—Emmanuel Bayard
(74) *Attorney, Agent, or Firm*—Foley & Lardner

(57) ABSTRACT

In a Viterbi decoder, a sequence of branch metrics is derived from a received convolutional codeword sequence. The branch metric sequence is divided and supplied to add/compare/select (ACS) circuits where the divided branch metric sequences added to previous path metrics. Path metric sequences of maximum likelihood paths are determined by the ACS circuits and indicators identifying the maximum likelihood paths are produced. A pipelining circuit is provided for reordering, or pipelining state metrics of the path metrics of the maximum likelihood paths and supplying the pipelined state metrics to the ACS circuits. The indicators from the ACS circuits are used to recover an original bit sequence.

4 Claims, 14 Drawing Sheets

CONVOLUTIONAL ENCODER

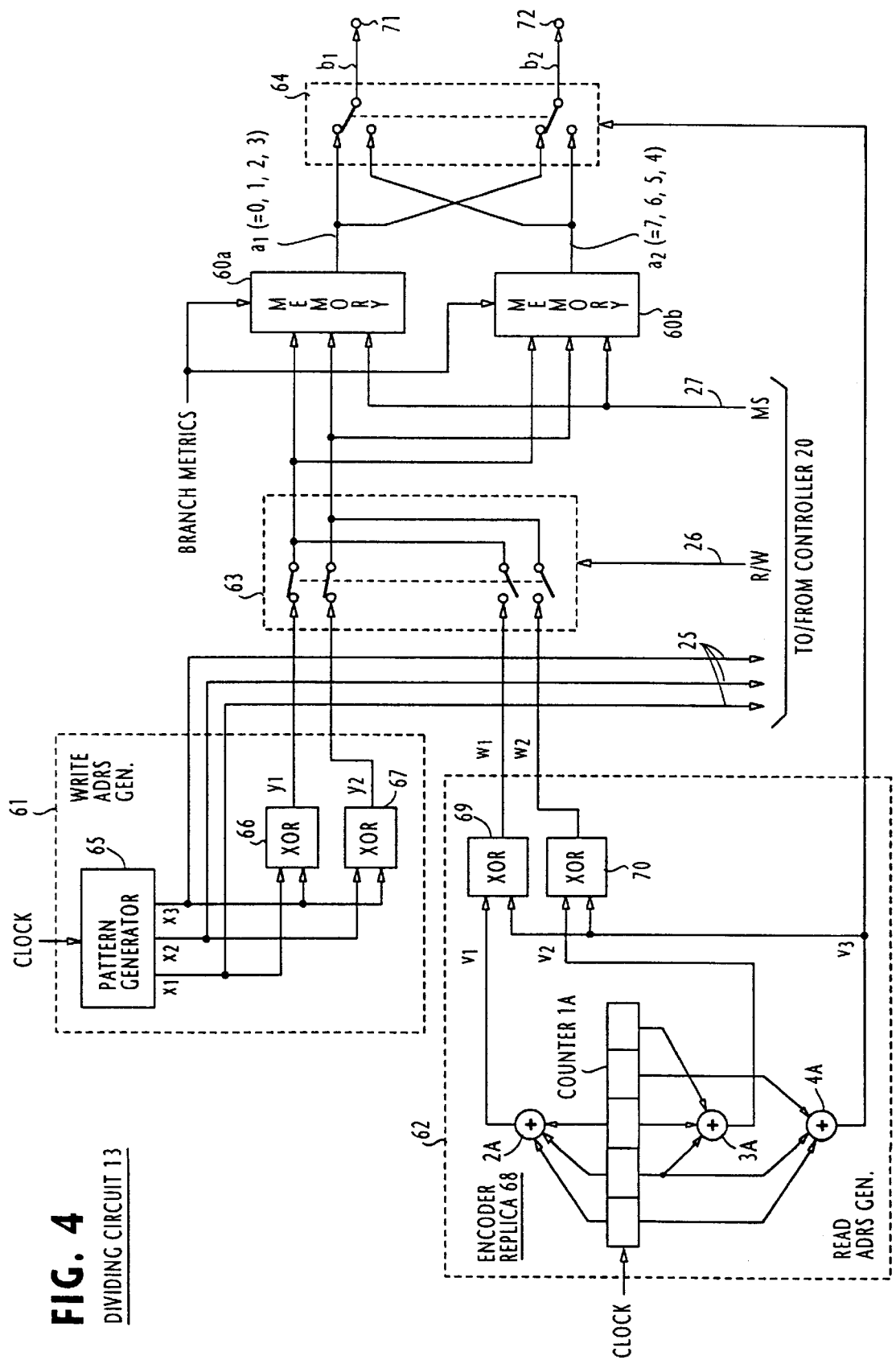
FIG. 4 DIVIDING CIRCUIT 13

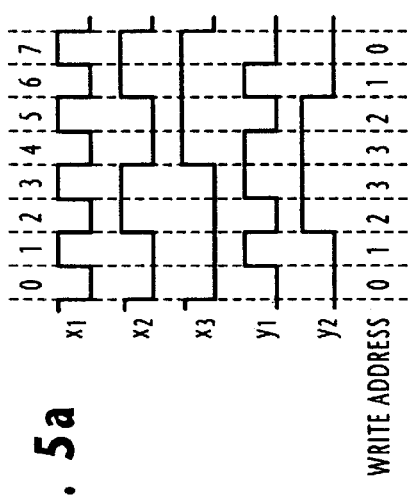
FIG. 5a
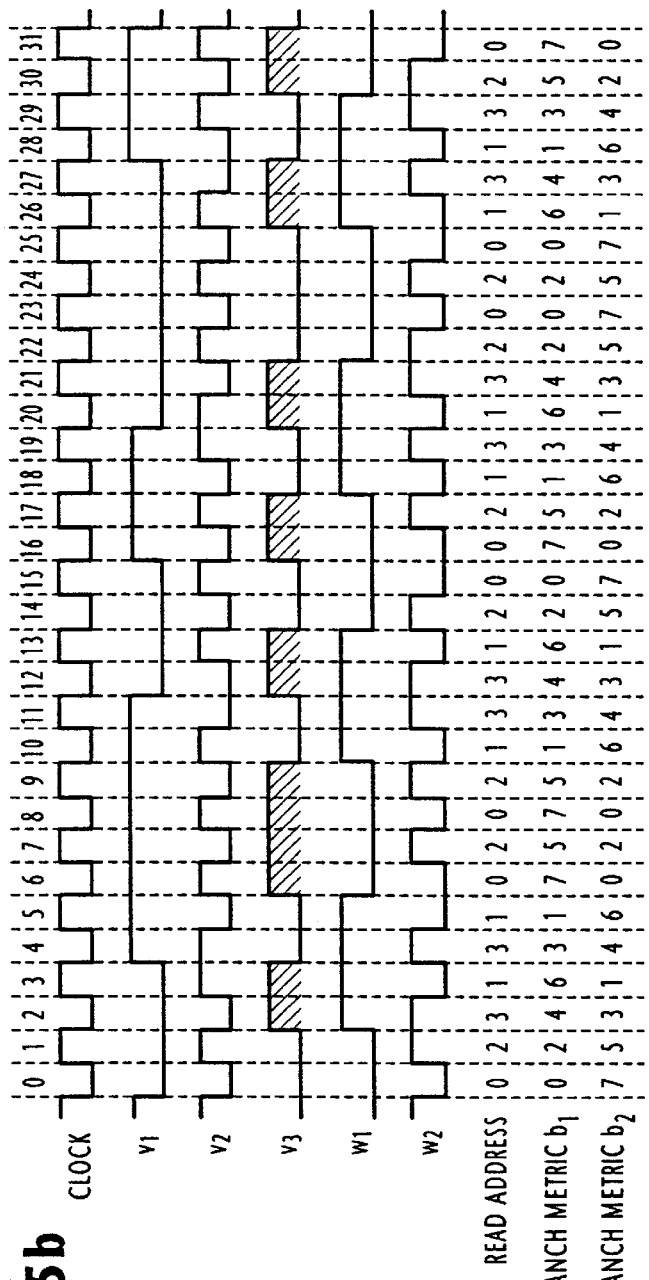
FIG. 5b
FIG. 5c

ACS CIRCUITS 14a, 14b

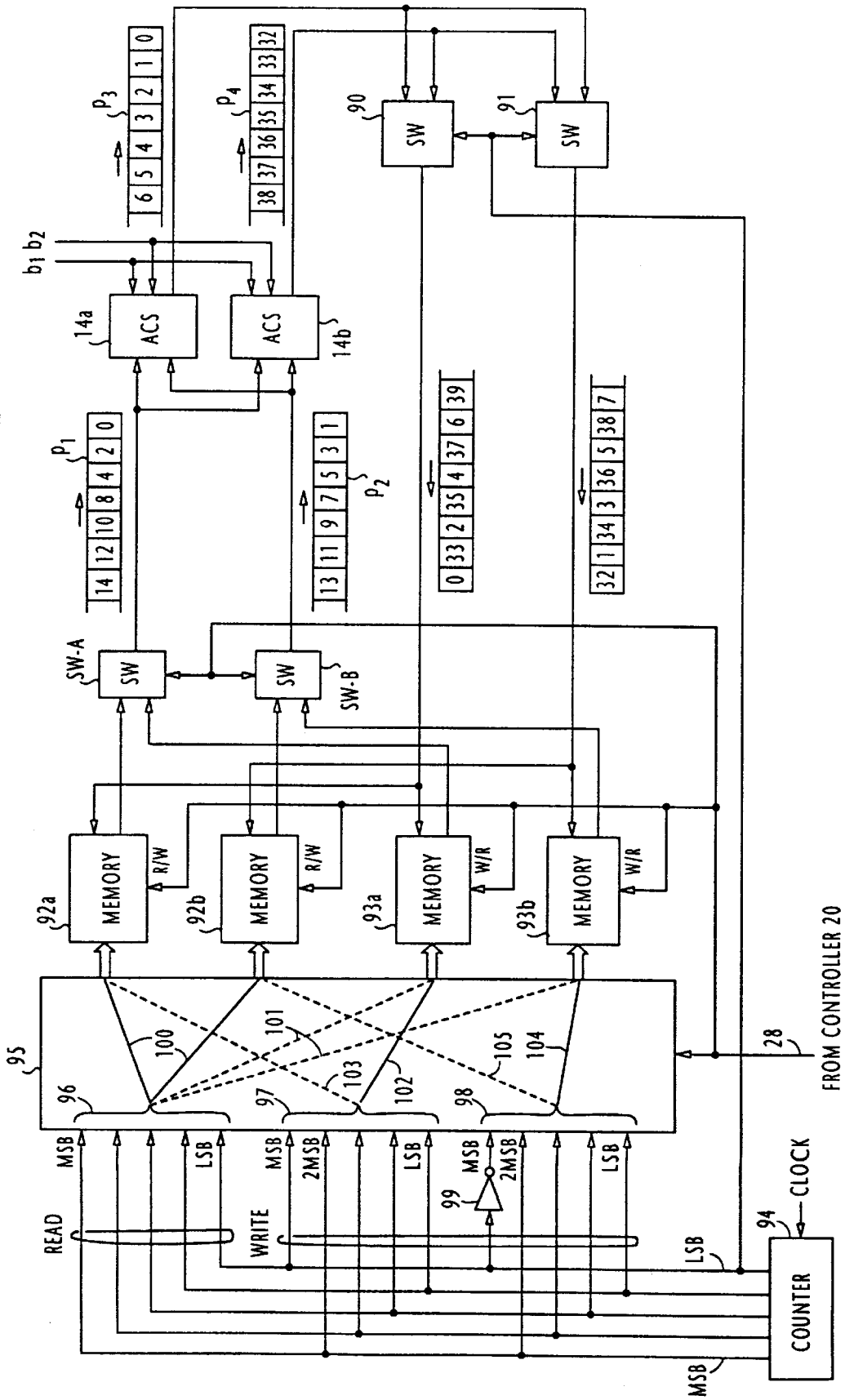

FIG. 8b

| READ ADDRESS (MSB → LSB) | WRITE ADDRESS FOR MEMORIES 92a, 93a (MSB → LSB) | WRITE ADDRESS FOR MEMORIES 92b, 93b (MSB → LSB) |
|---|---|---|
| 0 0 0 0 0 0 | 0 0 0 0 0 0 | 1 0 0 0 0 0 |
| 0 0 0 0 0 1 | 1 0 0 0 0 0 | 0 0 0 0 0 0 |
| 0 0 0 0 1 0 | 0 0 0 0 0 1 | 1 0 0 0 0 1 |
| 0 0 0 0 1 1 | 1 0 0 0 0 1 | 0 0 0 0 0 1 |
| 0 0 0 1 0 0 | 0 0 0 0 1 0 | 1 0 0 0 1 0 |
| ------ | ------ | ------ |
| 0 1 1 1 1 1 | 1 0 1 1 1 1 | 0 0 1 1 1 1 |
| 1 0 0 0 0 0 | 0 1 0 0 0 0 | 1 1 0 0 0 0 |
| 1 0 0 0 0 1 | 1 1 0 0 0 0 | 0 1 0 0 0 0 |
| 1 0 0 0 1 0 | 0 1 0 0 0 1 | 1 1 0 0 0 1 |
| 1 0 0 0 1 1 | 1 1 0 0 0 1 | 0 1 0 0 0 1 |
| 1 0 0 1 0 0 | 0 1 0 0 1 0 | 1 1 0 0 1 0 |
| ------ | ------ | ------ |
| 1 1 1 1 1 1 | 1 1 1 1 1 1 | 1 1 1 1 1 1 |

FIG. 8a

| MEMORIES 92a, 93a | ADDRESS | MEMORIES 92b, 93b |
|---|---|---|
| 0 | 0 0 0 0 0 | 1 |
| 2 | 0 0 0 0 1 | 3 |
| 4 | 0 0 0 1 0 | 5 |
| 6 | 0 0 0 1 1 | 7 |
| 8 | 0 0 1 0 0 | 9 |
| ------ | ------ | ------ |
| 30 | 0 1 1 1 1 | 31 |
| 33 | 1 0 0 0 0 | 32 |
| 35 | 1 0 0 0 1 | 34 |
| 37 | 1 0 0 1 0 | 36 |
| 39 | 1 0 0 1 1 | 38 |
| 41 | 1 0 1 0 0 | 40 |
| ------ | ------ | ------ |
| 63 | 1 1 1 1 1 | 62 |

Memories 92b, 93b — rows 1–9: ODD-NUMBERED METRIC STATES; rows 32–62: EVEN-NUMBERED METRIC STATES.

Memories 92a, 93a — rows 0–30: EVEN-NUMBERED METRIC STATES; rows 33–63: ODD-NUMBERED METRIC STATES.

| METRIC STATE | INPUT | ENCODER STATE TRANSITION $p_1/p_2$ | $p_3$ | OUTPUT | $a_1$ $b_1$ / $a_2$ $b_2$ | INPUT | ENCODER STATE TRANSITION $p_1/p_2$ | $p_4$ | OUTPUT | $a_1$ $b_1$ / $a_2$ $b_2$ |
|---|---|---|---|---|---|---|---|---|---|---|
| 26 | 0 | 110100 / 110101 | 011010 | 110 / 001 | 1 6 / 6 1 | 1 | 110100 / 110101 | 111010 | 001 / 110 | 6 1 / 1 6 |
| 27 | 0 | 110110 / 110111 | 011011 | 100 / 011 | 3 4 / 4 3 | 1 | 110110 / 110111 | 111011 | 011 / 100 | 4 3 / 3 4 |
| 28 | 0 | 111000 / 111001 | 011100 | 001 / 110 | 1 6 / 6 1 | 1 | 111000 / 111001 | 111100 | 110 / 001 | 6 1 / 1 6 |
| 29 | 0 | 111010 / 111011 | 011101 | 011 / 100 | 3 4 / 4 3 | 1 | 111010 / 111011 | 111101 | 100 / 011 | 4 3 / 3 4 |
| 30 | 0 | 111100 / 111101 | 011110 | 101 / 010 | 2 5 / 5 2 | 1 | 111100 / 111101 | 111110 | 010 / 101 | 5 2 / 2 5 |
| 31 | 0 | 111110 / 111111 | 011111 | 111 / 000 | 7 0 / 0 7 | 1 | 111110 / 111111 | 111111 | 000 / 111 | 0 7 / 7 0 |

FIG. 10

| INPUT | ENCODER STATE TRANSITION | | | | OUTPUT |
|---|---|---|---|---|---|
| | $p_1$ | | $p_3$ | | |
| 0 | $\begin{bmatrix} 1 & 0 & 0 \\ 1 & 0 & 1 \\ & j & \end{bmatrix}$ (i,0) | | $\begin{bmatrix} 0 & 0 \\ 1 & 1 & 0 \\ & j & \end{bmatrix}$ (0,j) | | 110 |
| | $p_2$ | | $p_3$ | | |
| 0 | $\begin{bmatrix} 1 & 0 & 0 \\ 1 & 0 & 1 \\ & j & \end{bmatrix}$ (i,1) | | $\begin{bmatrix} 0 & 1 \\ 1 & 1 & 0 \\ & j & \end{bmatrix}$ (0,j) | | 001 |
| | $p_1$ | | $p_4$ | | |
| 1 | $\begin{bmatrix} 1 & 0 & 0 \\ 1 & 0 & 1 \\ & j & \end{bmatrix}$ (i,0) | | $\begin{bmatrix} 1 & 0 \\ 1 & 1 & 0 \\ & j & \end{bmatrix}$ (1,j) | | 001 |
| | $p_2$ | | $p_4$ | | |
| 1 | $\begin{bmatrix} 1 & 0 & 0 \\ 1 & 0 & 1 \\ & j & \end{bmatrix}$ (i,1) | | $\begin{bmatrix} 1 & 1 \\ 1 & 1 & 0 \\ & j & \end{bmatrix}$ (1,j) | | 110 |

METRIC STATE 26

$\lambda(j0, 0j) = \lambda(j1, 1j)$
or $\lambda(j0, p_3) = \lambda(p_2, p_3)$ $\lambda(j1, 0j) = \lambda(j0, 1j)$
or $\lambda(p_2, p_3) = \lambda(p_1, p_4)$ $\lambda(j0, 0j) = \lambda(j1, 1j)$
or $\lambda(j0, p_3) = \lambda(p_2, p_4)$

FIG. 12  REORDERING CIRCUIT 150

FIG. 13

| | | | | | | | | | | | | | | | | |
|---|---|---|---|---|---|---|---|---|---|---|---|---|---|---|---|---|
| P1 | 0 | 2 | 4 | 6 | 8 | 10 | 12 | 14 | 16 | 18 | 20 | 22 | 24 | 26 | 28 | 30 |
| P2 | 1 | 3 | 5 | 7 | 9 | 11 | 13 | 15 | 17 | 19 | 21 | 23 | 25 | 27 | 29 | 31 |
| P3 | 32 | 34 | 36 | 38 | 40 | 42 | 44 | 46 | 48 | 50 | 52 | 54 | 56 | 58 | 60 | 62 |
| P4 | 33 | 35 | 37 | 39 | 41 | 43 | 45 | 47 | 49 | 51 | 53 | 55 | 57 | 59 | 61 | 63 |
| P5 | 0 | 1 | 2 | 3 | 4 | 5 | 6 | 7 | 8 | 9 | 10 | 11 | 12 | 13 | 14 | 15 |
| P6 | 32 | 33 | 34 | 35 | 36 | 37 | 38 | 39 | 40 | 41 | 42 | 43 | 44 | 45 | 46 | 47 |
| P7 | 16 | 17 | 18 | 19 | 20 | 21 | 22 | 23 | 24 | 25 | 26 | 27 | 28 | 29 | 30 | 31 |
| P8 | 48 | 49 | 50 | 51 | 52 | 53 | 54 | 55 | 56 | 57 | 58 | 59 | 60 | 61 | 62 | 63 |
| P9 | 0 | 16 | 2 | 18 | 4 | 20 | 6 | 22 | 8 | 24 | 10 | 26 | 12 | 28 | 14 | 30 |
| P10 | 32 | 48 | 34 | 50 | 36 | 52 | 38 | 54 | 40 | 56 | 42 | 58 | 44 | 60 | 46 | 62 |
| P11 | 1 | 17 | 3 | 19 | 5 | 21 | 7 | 23 | 9 | 25 | 11 | 27 | 13 | 29 | 15 | 31 |
| P12 | 33 | 49 | 35 | 51 | 37 | 53 | 39 | 55 | 41 | 57 | 43 | 59 | 45 | 61 | 47 | 63 |

18 CLOCK INTERVALS

VITERBI DECODER WITH PIPELINED ACS CIRCUITS

BACKGROUND OF THE INVENTION

1. Field of the Invention

The present invention relates generally to trellis-coded communications systems, and more specifically to Viterbi decoder having a high processing speed.

2. Description of the Related Art

A Viterbi decoder with a code rate ½ and a constraint length 3 (four metric states) is disclosed in Japanese Laid-Open Patent Specification Hei-6-303153. The disclosed decoder includes a branch metric calculator and a pair of add/compare/select (ACS) circuits to which the outputs of the branch metric calculator are supplied on a time-shared basis. The outputs of the ACS circuits are stored back into memories as intermediate results of an ACS process to be updated with new branch metrics from the calculator. A maximum likelihood decision circuit compares path metrics from the ACS circuits to select path metrics of the most likely path in the trellis diagram.

In most data communication systems, however, the constraint length is usually 7 which implies that the metric states amount to as large as 64. If a Viterbi decoder with constraint length 7 were implemented using the prior art technique, it would be necessary to provide as many connections for the data path of the path metrics as there are state metrics. Since the access to the path metric memories is a dominant factor on the overall performance of the Viterbi decoder, a long queue would be formed in the ACS circuits if parallel mode of operation is implemented.

SUMMARY OF THE INVENTION

It is therefore an object of the present invention to provide a Viterbi decoder in which a high speed operation is achieved by having a plurality of ACS circuits operate continuously on a pipelined basis.

According to the present invention, there is provided a Viterbi decoder for receiving a sequence of convolutional codewords, comprising means for deriving a sequence of branch metrics from the received codeword sequence, and means for dividing the branch metric sequence into a plurality of branch metric sequences. A plurality of add/compare/select (ACS) circuits are provided for adding the branch metric sequences to a plurality ACS of previous path metrics and determining therefrom a plurality of sequences of path metrics of maximum likelihood paths and a plurality of indicators identifying the maximum likelihood paths. A pipelining circuit is provided for reordering, or pipelining state metrics of the path metrics of the maximum likelihood paths and supplying the pipelined state metrics to the ACS circuits. The indicators from the ACS circuits are used to recover an original bit sequence.

According to one embodiment, the pipelining circuit comprises a first bank of first and second memories and a second bank of first and second memories, and a control circuit for controlling the memories of the banks. During write operation, state metrics of respective path metric sequences from he ACS circuits are stored into the first and second memories of the first bank and state metrics of the respective path metric sequences are subsequently stored into the first and second memories of the second bank. During read operation, a first sequence of even-numbered state metrics and a second sequence of odd-numbered sate metrics are read from the first memory of the first bank and supplied to the ACS circuits, and a first sequence of odd-numbered state metrics and a second sequence of even-numbered state metrics are read from the second memory of the first bank and supplied to the ACS circuits, wherein the first sequence of even-numbered state metrics and the first sequence of odd-numbered state metrics form state metrics of consecutive numbers of a first group, and the second sequence of even-numbered state metrics and the second sequence of odd-numbered state metrics form state metrics of consecutive numbers of a second group following the consecutive numbers of the first group.

According to another embodiment, the pipelining circuit comprises a first bank of first, second, third and fourth memories and a second bank of first, second, third and fourth memories, and a control circuit for controlling the memories of the banks. During write operation, state metrics of respective path metric sequences from the ACS circuits are stored into the first, second, third and fourth memories of the first bank and state metrics of the respective sequences are subsequently stored into the first, second third and fourth memories of the second bank. During read operation, a first sequence of even-numbered state metrics is read from the first memory, a second sequence of odd-numbered state metrics is read from the second memory, a third sequence of even-numbered state metrics is read from the third memory, and a fourth sequence of odd-numbered state metrics is read from the fourth memory, the first and second sequences forming state metrics of consecutive numbers of a first group, and the third and fourth sequences forming state metrics of consecutive numbers of a second group following the consecutive numbers of the first group, wherein the state metrics read from the first and third memories of the first bank are supplied to a first group of the ACS circuits and the state metrics read from the second and fourth memories of the first bank are supplied to a second group of the ACS circuits.

BRIEF DESCRIPTION OF THE DRAWINGS

The present invention will be described in further detail with reference to the accompanying drawings, in which:

FIG. 4 is a block diagram of a dividing circuit of the present invention;

FIG. 5a is a timing diagram of pulse sequences produced by a write address generator of the dividing circuit;

FIG. 5b is a timing diagram of pulse sequences produced by a read address generator of the dividing circuit and their relationships with two output sequences of branch metrics delivered from the dividing circuit;

FIG. 5c is a tabulation of relationships between the read address and branch metric pairs;

FIG. 7 is a block diagram of a reordering circuit of the present invention;

FIG. 8a is a table for mapping the relationships between read and write addresses used by the memories of the reordering circuit;

FIG. 8b is a table for mapping the contents of the memories of the reordering circuit to corresponding read/write addresses;

FIGS. 9a, 9b and 9c are tables mapping the relationships between encoder's operating states and decoder's branch metrics and path metrics;

FIG. 10 is a table for mapping the relationships between encoder's initial states and encoder's resultant states depending on input values for an example metric state;

FIG. 13 is a timing diagram of the various path metric sequences appearing in the reordering circuit of FIG. 12.

DETAILED DESCRIPTION

Figure 1:
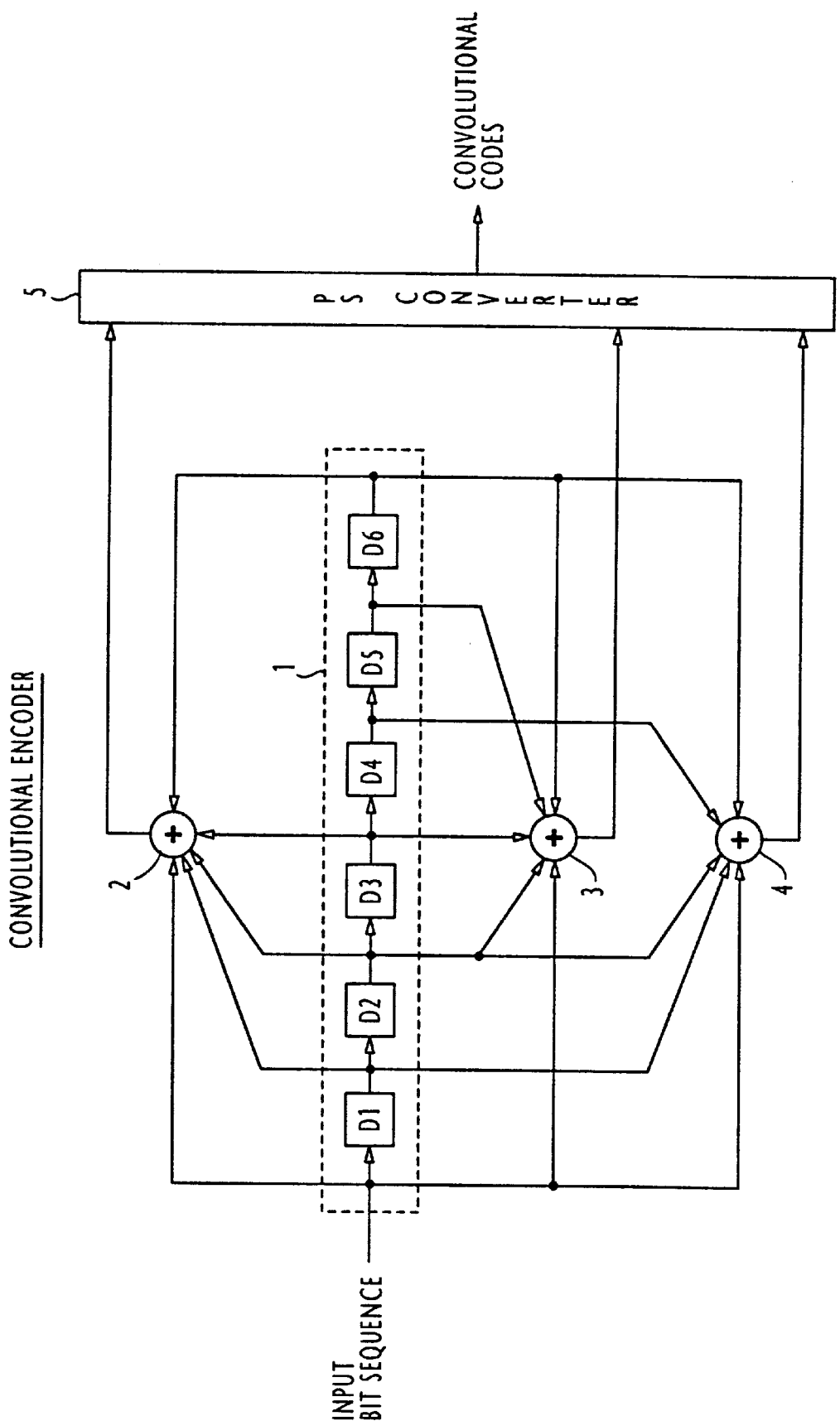
FIG. 1 is a block diagram of a convolutional encoder used at the transmit end of a communication link for describing the Viterbi decoder of the present invention located at the receive end of the link.

Before proceeding with the description of a Viterbi decoder of the present invention, it is useful to explain a convolutional encoder with a constraint length 7 and a code rate ⅓ with reference to FIG. 1. The convolutional encoder comprises a six-stage shift register 1, modulo-2 adders 2, 3 and 4, and a parallel-to-serial converter 5. The input terminals of stages D1 to D4 and the output terminal of stage D6 of shift register 1 are connected to adder 2 to produce a first output pulse sequence by operating a generator polynomial "1111001" on an input pulse sequence supplied to the input of the shift register 1. The input terminals of stages D1, D3, D4, D6 and the output terminal of stage D6 are connected to adder 3 to produce a second output pulse sequence by operating a generator polynomial "1011011" on the input pulse sequence. A third output pulse sequence is produced by coupling the input terminals of stages D1, D3, D5 and the output terminal of stage D6 to adder 4 by operating a generator polynomial "1110101" on the input pulse sequence. The pulses of these output sequences are multiplexed in the parallel-to-serial converter 5 into convolutional codewords.

Figure 2:
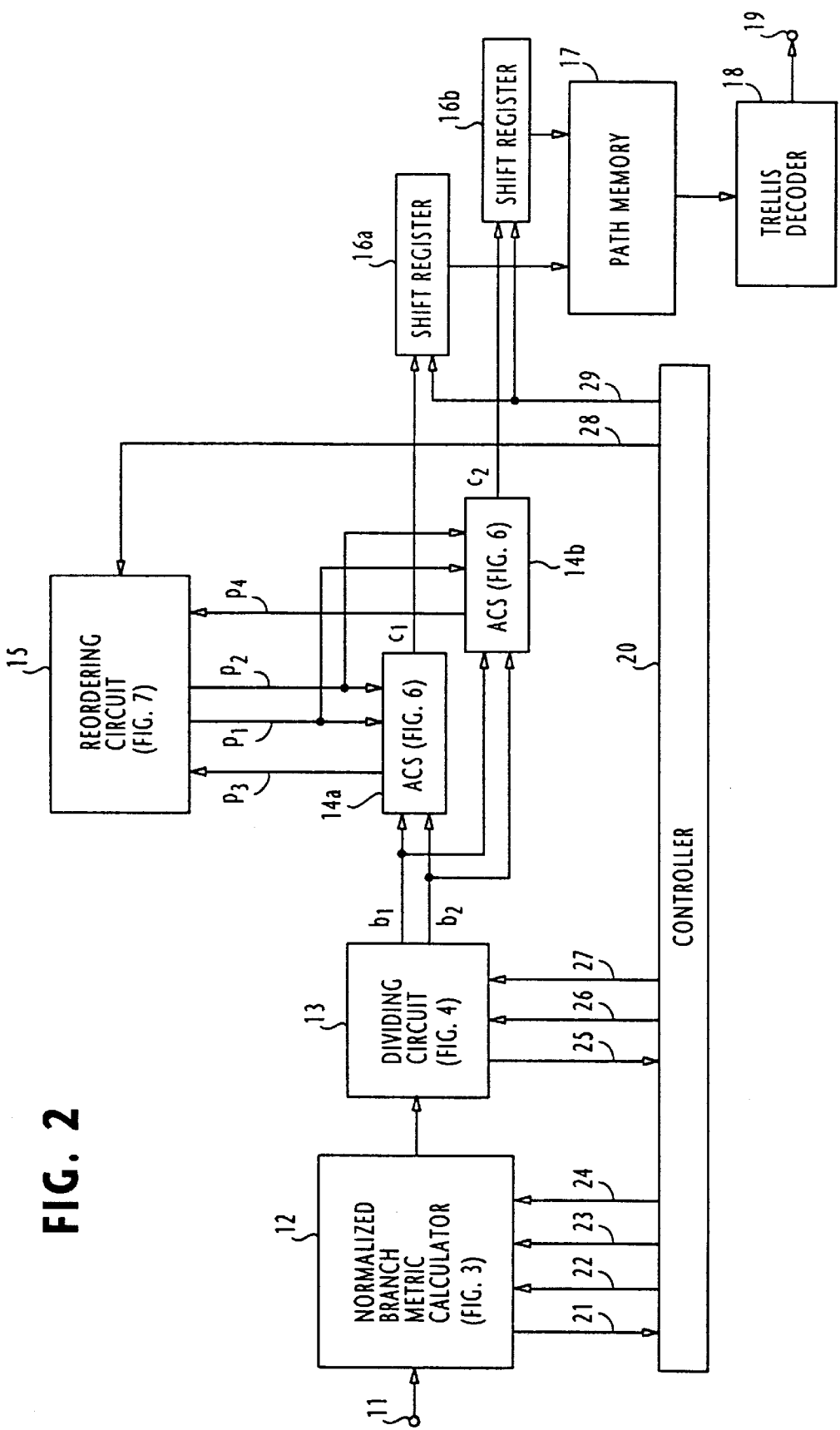
FIG. 2 is a block diagram of a general configuration of the Viterbi decoder of the present invention.

In FIG. 2, the Viterbi decoder according to one embodiment of the present invention is illustrated. The decoder generally comprises a normalized branch metric calculator 12 to which convolutional codes at baseband are supplied through an input terminal 11. The calculator 12 produces normalized branch metrics from he received convolutional codewords and feeds a dividing circuit 13, where the branch metrics are divided into two branch metrics $b_1$ and $b_2$. To the outputs of dividing circuit 13 are connected first and second add-compare-select (ACS) circuits 14a and 14b. ACS circuit 14a adds branch metric $b_1$ to path metric $p_1$ from a path metric pipelining or reordering circuit 15 and adds branch metric $b_2$ to path metric $p_2$ and produces a minimum path metric $p_3$ and a path indicator $c_1$ indicating the identity of the surviving path of the metric $p_3$. ACS circuit 14b, on the other hand, adds $b_2$ to $p_1$ and $b_1$ to $p_2$ and produces a minimum path metric $p_4$ and a path indicator $c_2$ the identity of the surviving path of the metric $p_4$. The path metrics $p_3$ and $p_4$ are supplied to the reordering circuit 15, where they are reordered into sequences $p_1$ and $p_2$ and fed back again to ACS circuits 14a and 14b, respectively.

The path indicators $c_1$ and $c_2$ are fed to shift registers 16a and 16b, respectively. At appropriate timing the path indicators are supplied from the shift registers to a path memory 17. A trellis decoder 18 is connected to the path memory 17 to perform a trellis search on the path indicators stored ion memory 17 to produce a replica of the input sequence applied to the convolutional encoder of FIG. 1.

Overall sequence control of the Viterbi decoder is provided by a controller 20 through control lines 21 to 29.

The convolutional codes received at the input terminal 11 are operated on a per-three-symbol basis, thus yielding the following eight ($=2^3$) possible patterns:

Pattern 0 (1, 1, 1)
Pattern 1 (−1, 1, 1)
Pattern 2 (1, −1, 1)
Pattern 3 (−1, −1, 1)
Pattern 4 (1, 1, −1)
Pattern 5 (−1, 1, −1)
Pattern 6 (1, −1, −1)
Pattern 7 (−1, −1, −1)

Branch metric calculator 30 has a serial-to-parallel converter 40 where the input sequence is converted into parallel bits $x_n$, $y_n$ and $z_n$. The Euclidean distance D between a received symbol sequence ($x_n$, $y_n$, $z_n$) and each branch metric pattern ($r_{0i}$, $r_{1i}$, $r_{2i}$) is determined by the following equation:

$$D=(x_n-r_{0i})^2+(y_n-r_{1i})^2+(z_n-r_{2i})^2 \qquad (1)$$

Using pattern 3, for example, equation (1) can be rewritten as:

$$D_3=(x_n^2+2x_n+1)+(y_n^2+2y_n+1)+(z_n^2-2z_n+1)=(x_n^2+y_n^2+z_n^2+3)-2(-x_n-y_n+z_n) \qquad (2)$$

Similar calculations are performed on the rest of the eight patterns. Since the first term of equation (2) appears in the calculations of all branch metric patterns, it is only necessary to calculate the second term. The calculation of the second term is a process of inner product calculations between ($x_n$, $y_n$, $z_n$) and ($r_{0i}$, $r_{1i}$, $r_{2i}$).

Figure 3:
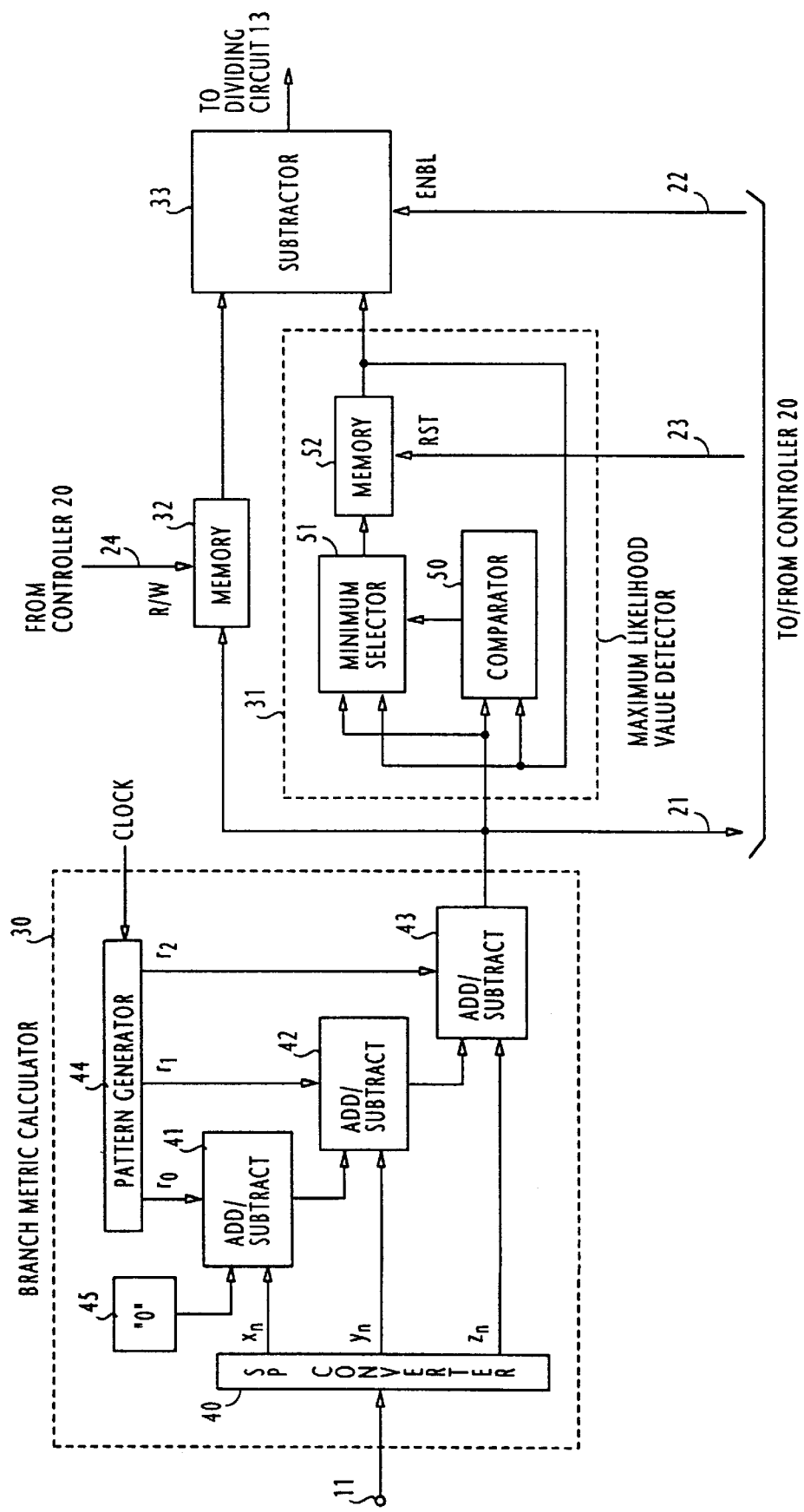
FIG. 3 is a block diagram of a normalized branch metric calculator of the present invention.

As shown in detail in FIG. 3, the normalized branch metric calculator 12 comprises a branch metric calculator 30, a maximum likelihood value detector 31, a memory 32 and a subtractor 33.

Branch metric calculator 30 includes a serial-to-parallel converter 40 where the received convolutional code is converted into parallel bits $x_n$, $y_n$ and $z_n$. In a practical embodiment, the inner product calculation is implemented by add/subtract circuits 41, 42 and 43 and a pattern generator 44, using two's complement notation. The parallel bits $x_n$, $y_n$ and $z_n$ from converter 40 are respectively supplied to add/subtract circuits 41, 42 and 43. The pattern generator 44 is a three-bit counter which is incremented by a clock pulse to cyclically produce the eight branch metric patterns for each set of input bits $x_n$, $y_n$ and $z_n$ and the elements $r_{0i}$, $r_{1i}$, $r_{2i}$ of each pattern are supplied to add/subtract circuits 41, 42 and 43, respectively, as add-or-subtract command signals. To implement the two's complement calculation, a 0-bit input sequence is supplied from a 0-bit generator 45 to add/subtract circuit 41. The output of add/subtract circuit 41 is coupled to add/subtract circuit 42 whose output is, in turn, connected to add/subtract circuit 43.

The output of add/subtract circuit 43 is supplied to the maximum likelihood value detector 31. Detector 31 includes a comparator 50, a minimum selector 51 and a memory 52. Each of the eight branch metrics from the add/subtract circuit 43 is compared by the comparator 50 with a branch metric stored in the memory 52 to produce a command signal indicating which branch metric is smaller than the other. Minimum selector 51 responds to this command signal for selecting one of the input branch metric and the stored branch metric having a smaller value. The selected branch metric is stored into the memory 52 by replacing the previous one. The process is repeated until all the eight branch metrics are compared with each other. Controller 20 monitors control line 21 and begins counting each branch metric as the first pattern appears at the output of add/subtract 43. At the end of the comparison process, a branch metric of minimum value is stored in the memory 52 and then delivered to the subtractor 33 when the latter is activated by an enabling signal from controller 20 via line 22. Controller 20 then initializes the memory 52 via control line 23. Meanwhile, controller 20 commands the memory 32 via line 24 to set it in a write mode for storing the eight branch metrics and then causes it to read them out into the subtractor 33, where the branch metric of the maximum value is subtracted from each of the stored branch metrics. In this way, branch metrics of normalized value are delivered from subtractor 33 to the dividing circuit 13.

This normalization advantageously reduces the amount of information to be processed in later stages of the Viterbi decoder, in particular, to prevent path metrics from being overflowed from memories in the later stages of the Viterbi decoder.

As illustrated in FIG. 4, the dividing circuit 13 includes memories 60a and 60b to which the normalized branch metrics are supplied. The write and read addresses for these memories is produced by a write address generator 61 and a read address generator 62. The outputs of these address generators are alternately supplied to the memories 60a, 60b via a switch 63.

Write address generator 61 has a pattern generator 65 for producing parallel bits $x_1$, $x_2$ and $x_3$, representing eight bit patterns (FIG. 5a). An exclusive-OR gate 66 receives the $x_1$ and $x_3$ bits to produce an output $y_1$ and an exclusive-OR gate 67 receives the $x_2$ and $x_3$ bits to produce an output $y_2$. As shown in FIG. 4a, the parallel bits $y_1$ and $y_2$ are in a cyclic pattern of decimal numbers 0, 1, 2 and 3 corresponding respectively to the decimal numbers 0, 1, 2 and 3 of the x-bit pattern and decimal numbers 3, 2, 1 and 0 corresponding respectively to the decimal numbers 4, 5, 6 and 7 of the x-bit pattern.

Controller 20 monitors the $x_1$, $x_2$ and $x_3$ bits via control lines 25 to determine the switch timing of switch 63 and the read/write timing of memories 60a, 60b.

When write address codes are generated for a series of eight bit patterns, a write command signal is applied to the switch 63 through line 26 for coupling the write address to the memories 60a, 60b, if these write address codes correspond to x-bit patterns 0, 1, 2 and 3, memory 60a is selected by a memory select (MS) supplied from controller 20 via line 27 and if they correspond to x-bit patterns 4, 5, 6 and 7, memory 60b is selected. Therefore, normalized branch metrics of patterns 0, 1, 2 and 3 are stored in memory 60a and those of patterns 7, 6, 5 and 4 are stored in memory 60b in the same storage locations as those in memory 60a. In other words, normalized branch metrics of patterns 0 and 7 form a pair and are stored in the same locations (i.e., $y_1=0$, $y_2=0$) of the respective memories 60a and 60b, and those of patterns 1 and 6 form a pair and are stored in the same locations (i.e., $y_1=1$, $y_2=0$) of memories 60a and 60b, and so forth.

The branch metrics stored pairwise in memories 60a and 60b are read out of these memories as branch metric sequences $a_1$ (=0, 1, 2, 3) and $a_2$ (=7, 6, 5, 4) by the read address generator 62 so that each pair of read branch metrics corresponds to each branch of the trellis diagram. Read address generator 62 comprises an encoder replica 68 and exclusive-OR gates 69 and 70 connected to the modulo-2 adders 2, 3, and 4 of the encoder replica.

Encoder replica 68 is of generally similar construction to the convolutional encoder of FIG. 1 with the exception that the six-stage shift register 1 is replaced with a 5-bit counter 1A and the first, second and third stages of the counter are connected to modulo-2 adder 2A and its output signal $v_1$ (LSB) is supplied to the exclusive-OR gate 69. The counter's second, third and fifth stages are connected to adder 3A and its output signal $v_2$ is supplied to the exclusive-OR gate 70, the counter's first, second and fourth stages being connected to adder 4a and its output signal $v_3$ (MSB) being connected to the exclusive-OR gates 69 and 70. Exclusive-OR gates 69 and 70 produce output signals $w_1$ and $w_2$ which form a 2-bit read address code, the read address code being supplied through switch 63 to the memories 60a and 60b.

During the read mode, memories 60a and 60b are simultaneously selected by controller 20 in order to read the stored branch metrics in a pairwise fashion. In response to each two-bit address code, a pair of branch metrics is read pairwise from memories 60a and 60b during the interval of metric states 0 to 31, as shown in FIG. 5b. Because of the two-parallel ACS operation for the 64 distinct metric states, the same bit patterns are repeatedly produced during the interval of metric states 32 to 63. Relationships between the two-bit read address codes and corresponding branch metric pairs are shown in FIG. 5c.

The output signal $v_3$ of the read address generator is further supplied to a switching circuit 64 for establishing straight connections between memories 60a and 60b and output terminals 71 and 72 when the signal $v_3$ is at logic 0 and reversing the connections when the signal $v_3$ is at logic 1. The normalized branch metrics sequences $b_1$ and $b_2$ and delivered to the ACS circuits via output terminals 71 and 72. The reason for reversing the connections between memories 60a, 60b and terminals 71, 72 will be described later.

Since the convolutional encoder has a constraint length 7, the Viterbi decoder has 64 ($=2^{7-1}$) distinct states, or state metrics. The ACS circuits 14a and 14b, shown in detail in FIG. 6, perform add/compare/select computations simultaneously on two states at a time.

In the ACS circuit 14a, the branch metric sequences $b_1$ and $b_2$ are summed with path metrics $p_1$ and $p_2$, respectively, to produce cumulative path metrics $r_1$ and $r_2$ at each state. A comparator 82 is connected to the outputs of the adders 80 and 81 for comparison between the path metrics $r_1$ and $r_2$ and produces an output signal $c_1$, indicating the identity of a surviving path $p_3$ whose path metric is smaller than the other. This signal is applied to a selector 83 for selecting the surviving path metric $p_3$ for coupling to the reordering circuit 15.

In the ACS circuit 14b, the branch metric sequences $b_2$ and $b_1$ are received by adders 84 and 85 where the sequences $b_2$ and $b_1$ are summed with path metrics $p_1$ and $p_2$, respectively, to produce cumulative path metrics $r_3$ and $r_4$ at each state. A comparator 86 is connected to the outputs of the adders 84 and 85 where the cumulative path metrics $r_3$ and $r_4$ are compared with each other and an output signal $c_2$ is produced, indicating the identity of a surviving path $p_4$ having the smallest path metric. This signal is applied to a selector 87 for selecting the surviving path metric $p_4$ for coupling to the reordering circuit 15. The survivors' path identity data $c_1$ and $c_2$ for each state are supplied to shift registers 16a and 16b, respectively.

Sequences of path metrics $p_3$ and $p_4$ are reordered in the reordering circuit 15 and then fed back to the ACS circuits as path metric sequences p₁ and p₂ for updating their metric values with new branch metrics. The updating operation of the ACS circuits will be discussed in detail later.

The reordering circuit 15 rearranges the sixty-four state metrics which are supplied from the ACS circuits 14a and 14b as intermediate results for the next decoding step. As shown in FIG. 7, the reordering circuit 15 is composed of two memory banks 92 and 93 for storing sixty-four state metrics and reading two state metrics at a time from each memory bank. Memory bank 92 consists of memories 92a and 92b which receive inputs from the ACS circuits via switches 93a and 93b and supply their outputs to switches SW-A and SW-B. In like manner, memory bank 93 consists of memories 93a and 93b to receive inputs from switches 90, 91 and supply their outputs to switches SW-A and SW-B, respectively.

The switches SW-A and SW-B are operated by the controller 20 via line 28 so that the outputs of memory bank 92 are coupled to the ACS circuits 14a and 14b during the interval of state metrics 0 to 31 and the outputs of memory bank 93 are coupled to the ACS circuits during the interval of state metrics 32 to 63. Memory banks 92 and 93 are in read and write modes, respectively, during the interval of state metrics 0 to 31 and in write and read modes, respectively, during the interval of state metrics 32 to 63. As illustrated in FIG. 7, the state metrics from ACS circuits 14a are interchanged with those from ACS circuit 14b at every two-state intervals by switches 90 and 91, and supplied to memory banks 92 and 93.

As shown in FIG. 8a, even-numbered state metrics 0 to 30 and odd-numbered sate metrics 33 to 63 are stored in memories 92a and 93a, and odd-numbered state metrics 1 to 31 and even-numbered state metrics 32 to 62 are stored in memories 92b and 93b.

Such arrangements of the state metrics will be understood by considering a 6-stage shift register as follows.

Assume that the 6-stage shift register of the convolutional encoder of FIG. 1 is in a state "000000" (=state metric 0). The application of a bit "0" to the shift register simply shifts the all 0' bits to the right, and so the state of the shift register remains unchanged, but changes to "100000" (=state metric 32) in response to the application of a bit "1". If the shift register is in a state "000001" (=state metric 1), the application of a bit "0" to the shift register causes it to change to "000000" (=state metric 0), but changes to "100000" (=state metric 32) in response to the application of a bit "1". In the above examples, parallel operations by ACS circuits 14a and 14b are achieved by reading state metric 0 from memory 92a and state metric 1 from memory 92b and concurrently writing state metric 0 into memory 93a and state metric 32 into memory 93b. It will be seen from FIG. 6 that, in the next instant, state metrics 2 and 3 are read from memories 92a and 92b, while at the same time, state metrics 1 and 33 are written into memories 92a and 92b.

In order to achieve the read/write operation of memories 92 and 93 as discussed above, a 5-bit counter 94 is clocked to produce a 5-bit address code. The MSB to LSB of the address code are supplied to the MSB to LSB terminals 96 of a coupling circuit 95 as a read address and coupled to memories 92a and 92b as indicated by lines 100 when these memories are in a read mode and coupled to memories 93a and 93b as indicated by a dotted lines 101 when these memories are in a read mode.

To produce a write address for memories 93a and 92a, the MSB to the second LSB positions of the 5-bit address code of counter 94 are coupled to the second MSB to the LSB positions of terminals 97 of the coupling circuit 95 and the LSB of the code is supplied to the MSB position of terminals 97. The terminals 97 are coupled to the memory 93a via line 102 when this memory is in a write mode and coupled to the memory 92a via dotted line 103 when this memory is in a write mode.

As a write address for memories 93b and 92b, the MSB to the second LSB positions of the 5-bit address code of counter 94 are coupled to the second MSB to the LSB positions of terminals 98 of the coupling circuit 95 and the LSB of the code is supplied via an inverter 99 to the MSB position of terminals 98. The terminals 98 are coupled to the memory 93b via line 104 when this memory is in a write mode and coupled to the memory 92b via dotted line 105 when this memory is in a write mode.

The coupling circuit 95 changes its configuration between the solid-line connections and the dotted-line connections in response to a control signl supplied on line 28 from the controller 20. This control signal is also used to set memories 92 and 93 in read and write modes, respectively, when the solid-line connections are established in the coupling circuit 95 and to set memories 92 and 93 in write and read modes, respectively, when the dotted-line connections are established in the coupling circuit 95. FIG. 8b shows the 5-bit read address codes successively generated by the counter 94 and the corresponding 5-bit write address codes supplied to memories 92 and 93.

Figure 6:
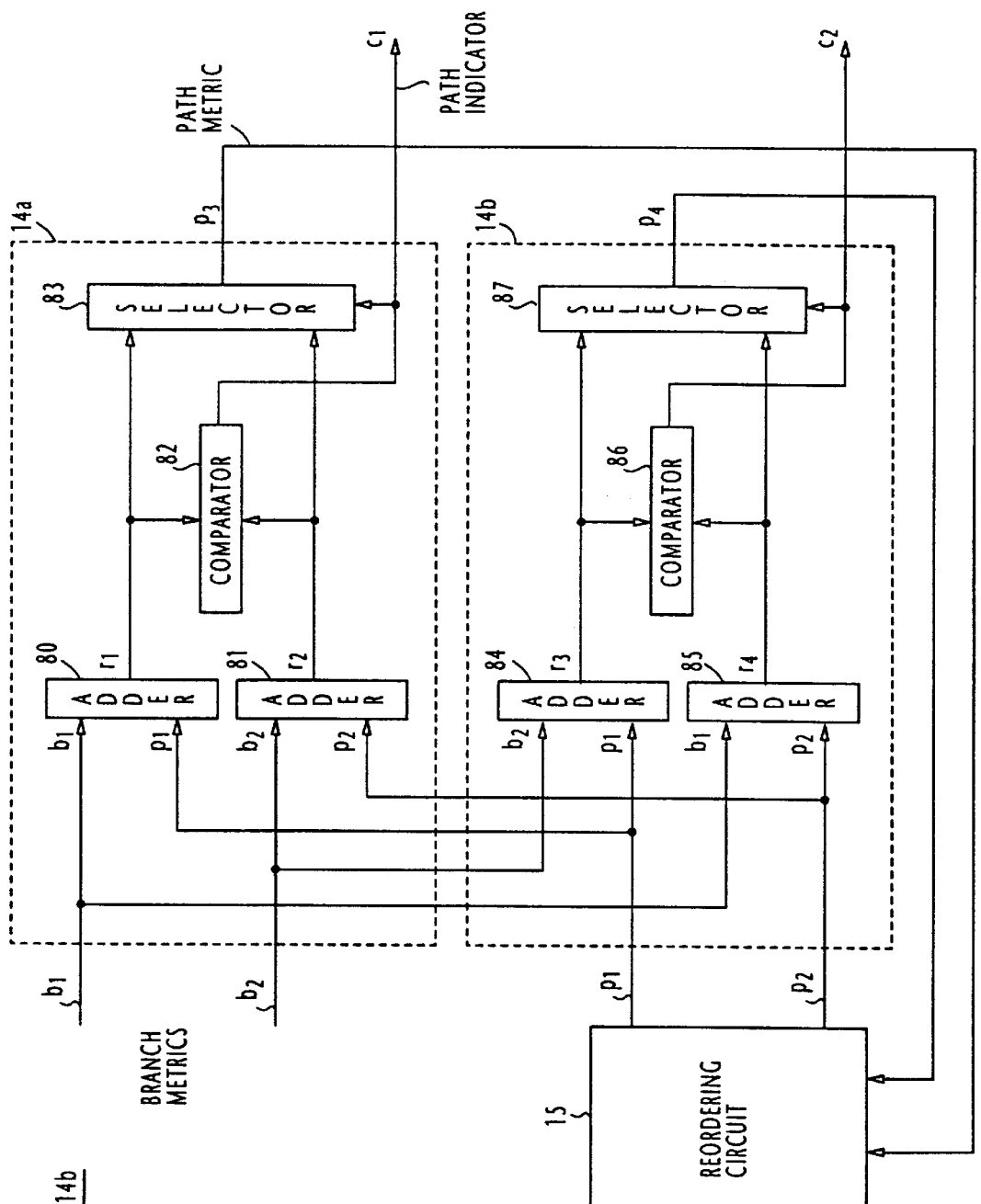
FIG. 6 is a block diagram of add/compare/select circuits of the present invention.

Reverting to FIGS. 6 and 7, the updating operation of the path metric values in the ACS circuits will now be described below.

ACS circuit 14a is responsible for the updating of the states 0 to 31 of path metrics $p_1$ and $p_2$, and ACS circuit 14b is responsible for the updating of the states 32 to 63 of these path metrics. Controller 20 has an index counter, now shown, which is set equal to 0 when state metrics 0 and 1 are read out of the memories 92a and 92b into both circuits at the beginning of a decoding cycle.

In the ACS circuit 14a, the adder 80 calculates a path metric $r_1$ corresponding to a transition from state 0 to state 0 by adding a new branch metric $b_1$ to path metric $p_1$, and the adder 81 calculates a path metric $r_2$ corresponding to a transition from state 1 to state 0 by adding a new branch metric $b_2$ to path metric $p_2$. Comparator 82 determines which of path metrics $r_1$ and $r_2$ has a smaller value and causes the selector 83 to select the smaller path metric as an updated state 0 of the surviving path metric $p_3$.

The transition from state 0 to state 0 corresponds to the application of a 0 to the shift register 1 of the FIG. 1 convolutional encoder in which all zero's are stored and the encoder produces an output sequence (0, 0, 0). Under this condition, branch metric 0 is supplied to the adder 80.

The transition form state 1 to state 0 corresponds to the application of a 0 to the shift register whose state is 0, 0, 0, 0, 0, 1 (=d1, D2, D3, D4 D5, D6) and the encoder produces an output sequence (1, 1, 1). Under this condition, branch metric 7 is supplied to the adder 81.

In the ACS circuit 14b, the adder 84 calculates a path metric $r_3$ corresponding to a transition from state 0 to state 32 by adding the new branch metric $b_2$ to path metric $p_1$, and the adder 85 calculates a path metric $r_4$ corresponding to a transition from state 1 to state 32 by adding the new branch metric $b_1$ to path metric $p_2$. Comparator 86 determines which of path metrics $r_3$ and $r_4$ has a smaller value and causes the selector 87 to select the smaller path metric as an updated state 32 of the surviving path metric $p_4$.

The transition from state 0 to state 32 corresponds to the application of a 1 to the shift register in which all zero's are stored and the encoder produces an output sequence (0, 0, 0). Under this condition, branch metric 7 is supplied to the adder 84.

The transition from state 1 to state 32 corresponds to the application of a 0 to the encoder' shift register whose stae is 0, 0, 0, 0, 0, 1 and the encoder produces an output sequence (0, 0, 0). Under this condition, branch metric 0 is supplied to the adder 85.

As the above process step is repeated, the controller's index counter is successively incremented from count 0, and at the end of the decoding cycle, the index counter reaches count 31. During each decoding cycle, state 0 to state 63 are updated.

Figure 9A:
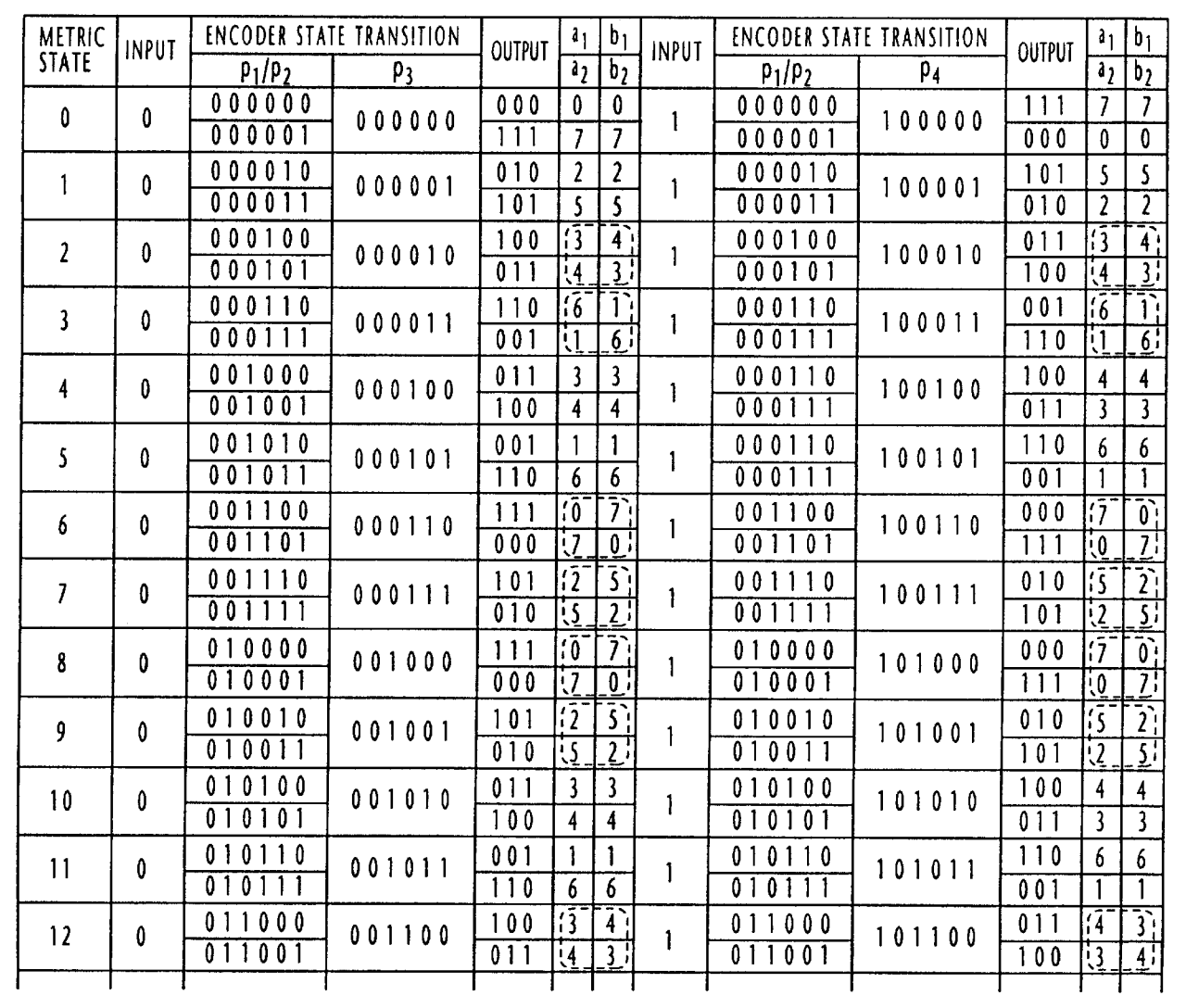
Figure 9B:
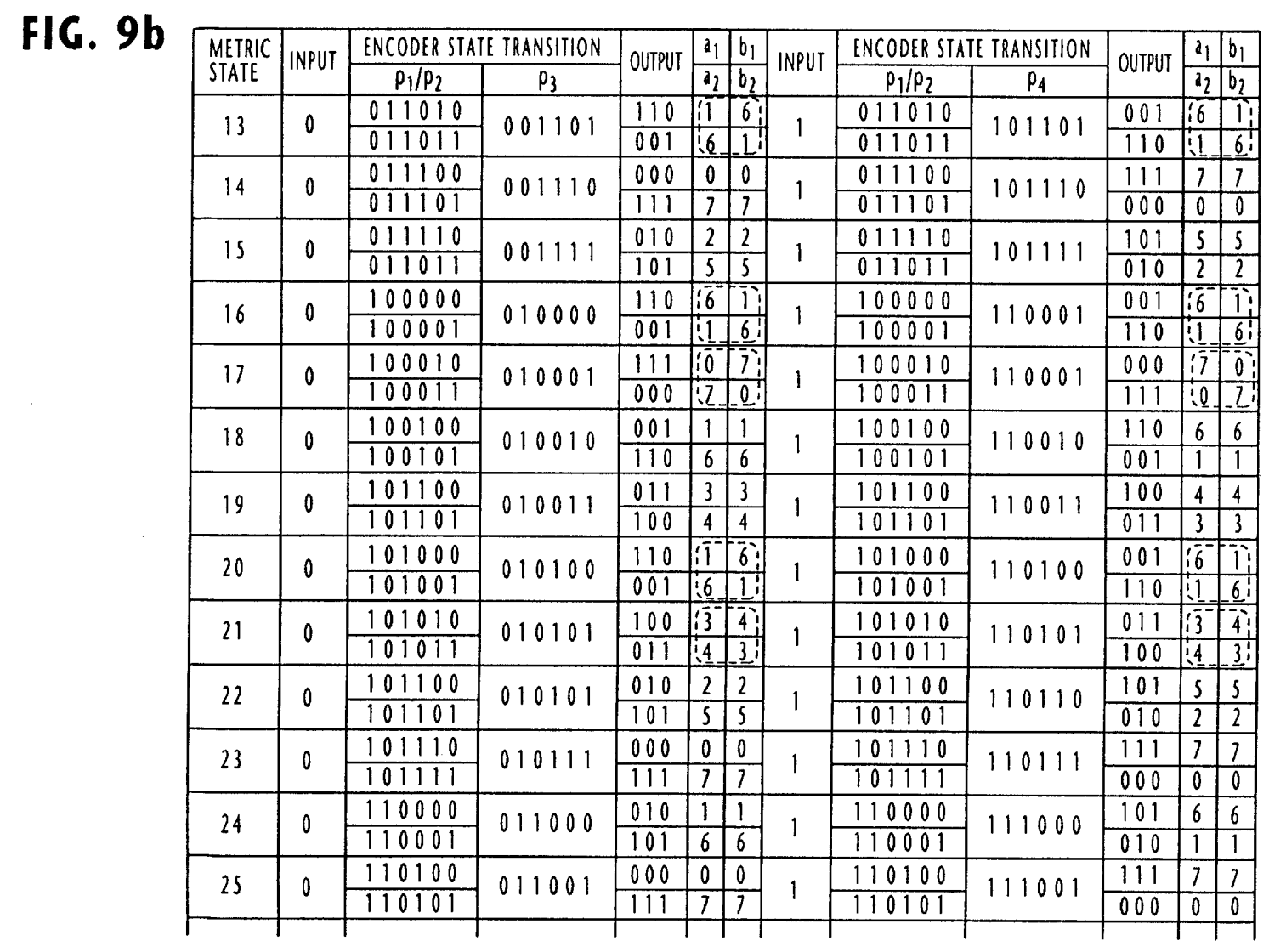

The encoder's transition states 0 to 31 and their relationships to branch metrics $a_1$, $a_2$, $b_1$, $b_2$ and path metrics $p_1$, $p_3$, $p_2$, $p_4$ are illustrated in the tables of FIGS. 9a, 9b and 9c.

It is appreciated that the branch metrics $a_1$ and $a_2$ are in reverse to corresponding branch metrics $b_1$ and $b_2$ for metric states 2, 3, 6, 7, 8, 9, 12, 13, 16, 17, 20, 21, 26, 27, 30 and 31 as indicated by dotted rectangles. These switching circuit 64 (FIG. 4) performs switching operation in response to the output $v_3$ of the encoder replica when these metric states occur (see also FIG. 5b).

The initial (shift register) state and the resultant state of the convolutional encoder in response to either a 0 or 1 are represented by:

Initial state=$j(=D_1, D_2, D_3, D_4, D_5)i(=D_6)$

Resultant state =$i(=D_1)j(D_2, D_3, D_4, D_5, D_6)$ where i=0 or 1, and j0 and j1 correspond respectively to path metrics $p_1$ and $p_2$ and 0j and 1j correspond respectively to path metrics $p_3$ and $p_4$.

Therefore, the ACS circuit 14a performs the following conversions:

$M_k(j0) \rightarrow \lambda(j0, 0j) \rightarrow M_{k+1}(0j)$ $M_k(j1) \rightarrow \lambda(j1, 0j) \rightarrow M_{k+1}(0j)$ The circuit 14b performs the following conversions:

$M_k(j0) \rightarrow \lambda(j0, 1j) \rightarrow M_{k+1}(1j)$ $M_k(j1) \rightarrow \lambda(j1, 1j) \rightarrow M_{k+1}(1j)$ where M respresnets the previous path metric, $\lambda$ represents the ACS computation, k=0, 1, ..., K, and j=0, 1, ..., 31. The value "j" respresnets the count value of the controller's index counter.

Figure 11:
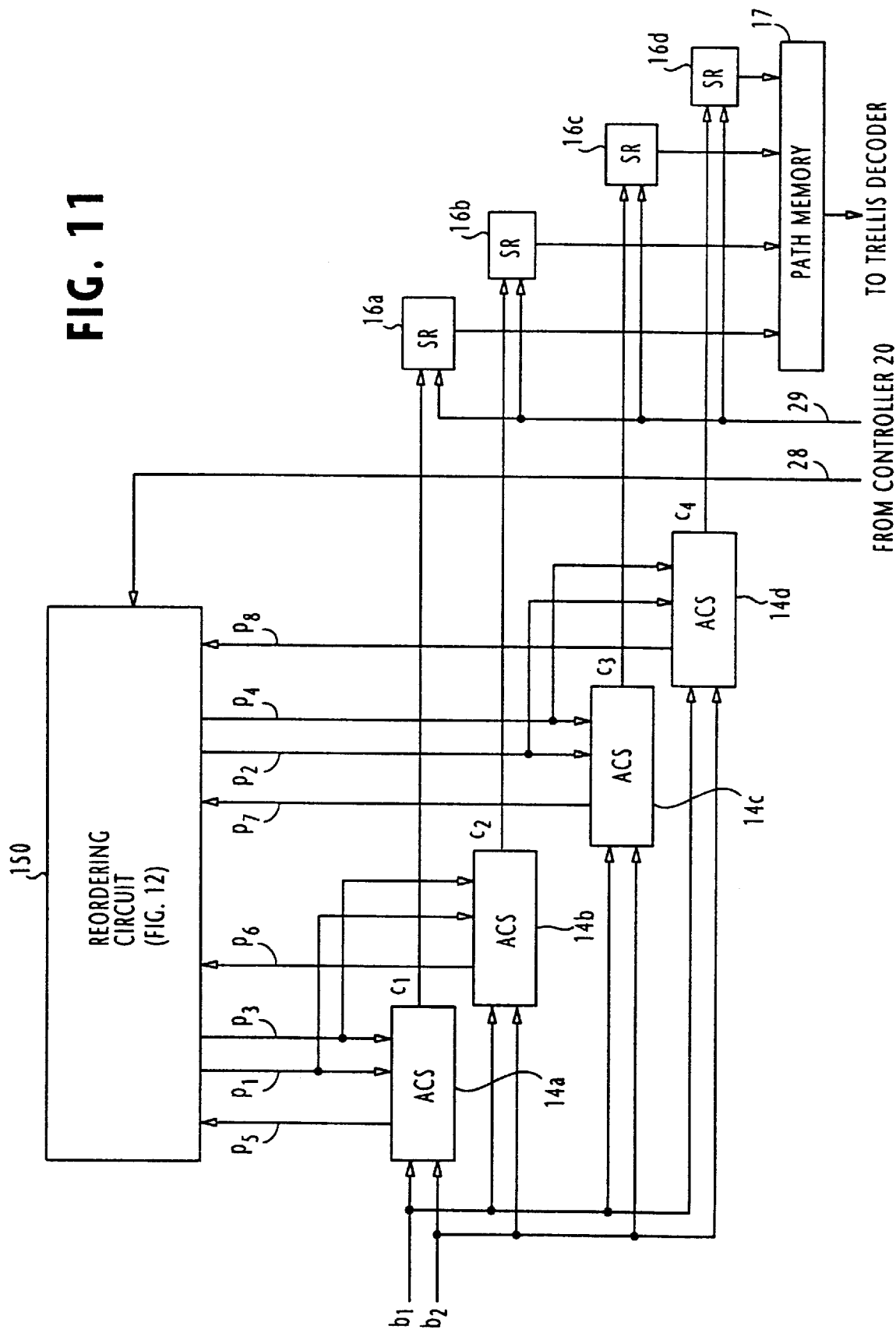
FIG. 11 is a block diagram of a modified Viterbi decoder of the present invention.

Taking metric state 26a as an example, it is seen from FIG. 10 that the following relations hold:

$\lambda(j0, 0j)=\lambda(j1, 1j)$ and hence $\lambda(p_1, p_3)=\lambda(p_2, p_4)$ $\lambda(j1, 0j)=\lambda(j0, 1j)$ and hence $\lambda(p_2, p_3)=\lambda(p_1, p_4)$ Since branch metric calculator 30, FIG. 3, determines Euclidean distances, the ACS circuits, in effect, calculates the following equations to select the minimum path metrics:

$M_{k+1}(0j)=\min\{M_k(j0)+\lambda(j0, 0j), M_k(j1)+\lambda(j1, 0j)\}$ $M_{k+1}(1j)=\min\{M_k(j0)+\lambda(j0, 1j), M_k(j1)+\lambda(j1, 1j)\}$ A modified embodiment of the Viterbi decoder is shown in FIG. 11. According to this modification, four ACS circuits 14a, 14b, 14c and 14d are provided for performing add/ compare/select operations on four metric states at a time in a parallel mode. ACS circuits 14a and 14b perform updating operations on path metrics $p_1$ and $p_3$ from a path metric reordering circuit 150 to store updated path metrics $p_5$ and $p_6$ back into the reordering circuit 150, and circuits 14c and 14d updates path metrics $p_2$ and $p_4$ to store updated path metrics $p_7$ and $p_8$ back into the reordering circuit 150. The normalized branch metric sequences $b_1$ and $b_2$ are supplied to all the All ACS circuits. Indicators $c_1$, $c_2$, $c_3$ and $c_4$ of surviving paths are generated by ACS circuits 14a to 14d and respectively fed to shift registers 16a to 16d, and then loaded into the path memory 17.

Figure 12:
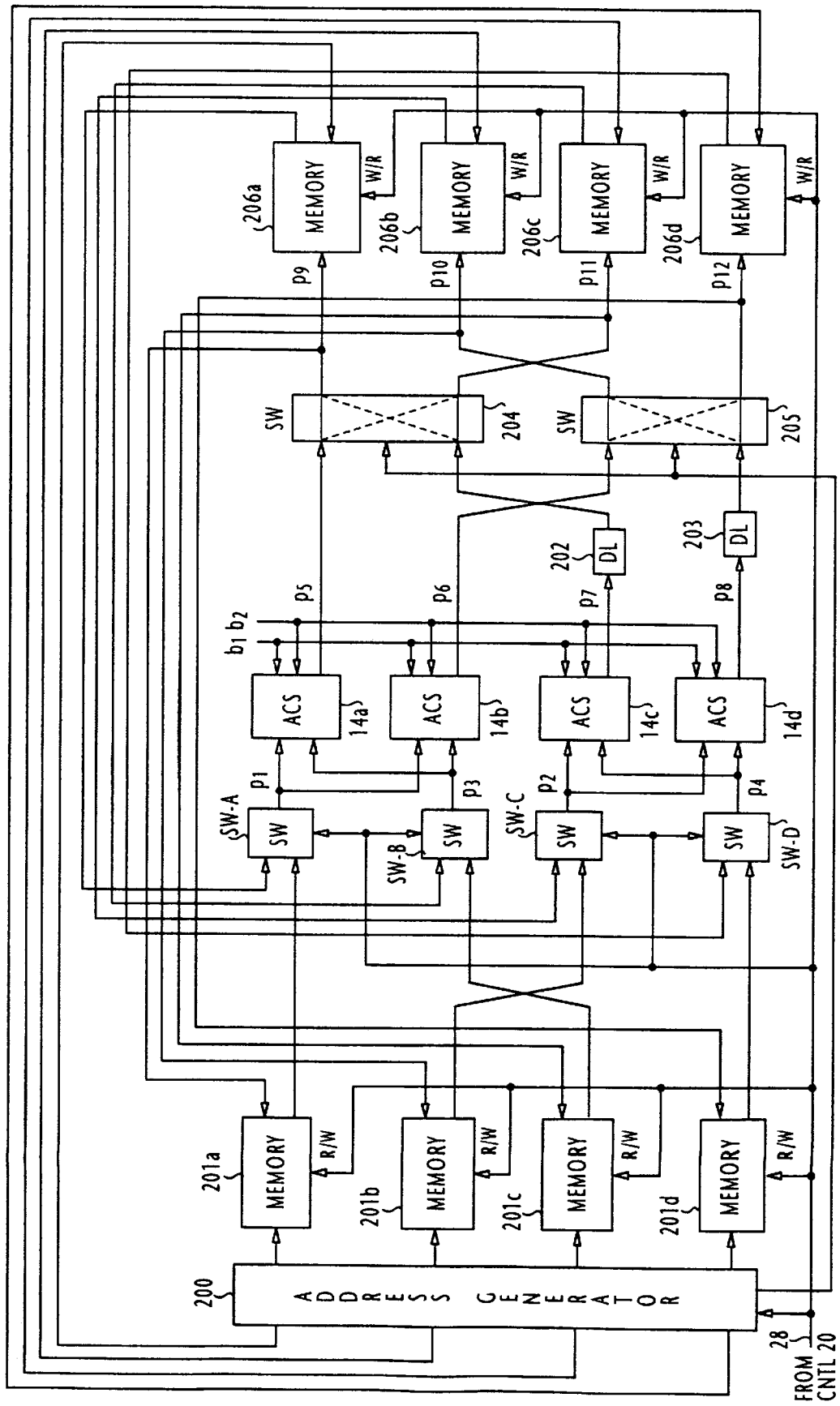
FIG. 12 is a block diagram of the reordering circuit of the modified Viterbi decoder.

As illustrated in FIG. 12, the path metric reordering circuit 150 includes a memory bank 201 of four memories 201a to 201d and a memory bank 206 of memories 206a to 206d. An address generator 200 supplies 4-bit address codes to all the memories, so that when memories of bank 201 are in a read mode, the memories of bank 206 are in a write mode, and vice versa. Path metric $p_1$ is formed by selectively connecting the outputs of memories 201a and 206a through a switch SW-A to the ACS circuit 14a. Path metric $p_2$ is formed by selectively connecting the outputs of memories 201b and 206b through a switch SW-B to the ACS circuit 14c. In like manner, path metric $p_3$ is formed by selectively connecting the outputs of memories 201c and 206c through a switch SW-C to the ACS circuit 14b, path metric $p_4$ being formed by selectively connecting the outputs of memories 201d and 206d through a switch SW-D to the ACS circuit 14d.

Path metrics $p_5$ and $p_6$ from ACS circuits 14a and 14b are respectively connected to cross-coupling switches 204 and 205. ACS circuit 14c produces a path metric sequence $p_7$ which is one-clock interval delayed by a delay element 202 and applied to cross-coupling switch 204, and similarly, ACS circuit 14c produces a path metric sequence $p_8$ which is one-clock interval delayed by a delay element 203 and applied to cross-coupling switch 205. Path metric $p_5$ and the delayed a path metric $p_7$ are cross-coupled through switch 204 to either memory 206a as a path metric $p_9$ or to memory 206c as a path metric $p_{11}$. Path metrics $p_6$ and the delayed path metric $p_8$ are cross-coupled through switch 205 to either memory 206b as a path metric $p_{10}$ or to memory 206d as a path metric $p_{12}$. Path metrics $p_9$, $p_{10}$, $p_{11}$ and $p_{12}$ are also supplied to memories 201a, 201b, 201c and 201d, respectively.

Controller 20 operates the switch SW-A to SW-D and the read/write timing of all the memories through control line 28 to produce the path metrics $p_1$ to $p_{12}$. Cross-coupling switches 204 and 205 are controlled by the address generator 200 to alternately connect their input sequences to their output terminals.

As shown in FIG. 13, path metric sequence $p_1$ is formed by even-numbered state metrics 0 to 30 and path metric sequence $p_2$ is formed by odd-numbered state metrics 1 to 31. Path metric sequence $p_3$ is composed of even-numbered state metrics 32 to 62 and path metric sequence $p_4$ is composed of odd-numbered state metrics 33 to 63.

From state metrics 0 to 32 of path metric sequences $p_1$ and $p_3$, ACS circuit 14a produces state metric 0 and ACS circuit 14b produces state metric 32. By using state metrics 1 and 33 of sequences $p_2$ and $p_4$, ACS circuit 14c produces state metric 16 of sequence $p_7$ and circuit 14d produces a state metric 48 of sequence $p_8$. As a result, the state metrics 0 and 32 are supplied to memories 206a and 206b as path metric sequences $p_9$ and $p_{10}$, respectively, and the state metrics 16 and 48 are supplied to memories 206a and 206b during the next clock interval. During the next clock interval, state metrics 1 ($p_5$), 33 ($p_6$), 17 ($p_7$) and 49 ($p_8$) are produced and state metrics 1 ($p_5$) and 33 ($p_6$) are supplied to memories 206c and 206d as sequences $p_{11}$ and $p_{12}$, respectively.

A total of 18 clock intervals is required to complete the ACS operations on state metrics 0 to 63. This total clock interval favorably compares with a total time of 132 clock intervals which is taken by the serial processing.

What is claimed is:

1. A Viterbi decoder for receiving a sequence of convolutional codewords, comprising:
    means for deriving a sequence of branch metrics from a received codeword sequence;
    means for dividing the branch metric sequence into a plurality of branch metric sequences,
    a plurality of add/compare/select (ACS) circuits for adding said branch metric sequences to a plurality of previous path metrics and determining therefrom a plurality of sequences of path metrics of maximum likelihood paths and plurality of indicators identifying the maximum likelihood paths;
    means for pipelining state metrics of said path metrics of said maximum likelihood paths and supplying the pipelined state metrics to said circuits as said ACS previous path metrics; and
    means for receiving indicators form said circuits and recovering therefrom an original bit sequence,
    wherein said pipelining means comprises:
        a first bank of first and second memories and a second bank of first and second memories; and
        control means for controlling the memories of said banks during write operation such that state metrics of respective path metric sequences from said ACS circuits are stored into the first and second memories of the first bank and state metrics of said respective sequences are subsequently stored into the first and second memories of the second bank,
        said control means controlling the memories of said banks during read operation such that a first sequence of even-numbered state metrics and a second sequence of odd-numbered state metrics are read from the first memory of the first bank and supplied to said ACS circuits, and a first sequence of odd-numbered state metrics and a second sequence of even-numbered state metrics are read from the second memory of the first bank and supplied to said ACS circuits,
        said first sequence of even-numbered state metrics and said first sequence of odd-numbered state metrics forming state metrics of consecutive numbers of a first group, and said second sequence of even-numbered state metrics and said second sequence of odd-numbered state metrics forming state metrics of consecutive numbers of a second group following the consecutive numbers of said first group.

2. A Viterbi decoder for receiving a sequence of convolutional codewords, comprising:
    means for deriving a sequence of branch metrics from a received codeword sequence;
    means for dividing the branch metric sequence into a plurality of branch metric sequences;
    a plurality of add/compare/select (ACS) circuits for adding said branch metric sequences to a plurality of previous path metrics and determining therefrom a plurality of sequences of path metrics of maximum likelihood paths and plurality of indicators identifying the maximum likelihood paths;
    means for pipelining state metrics of said path metrics of said maximum likelihood paths and supplying the pipelined state metrics to said circuits as said ACS previous path metrics; and
    means for receiving indicators form said ACS circuits and recovering therefrom an original bit sequence,
    wherein said pipelining means comprises:
        a first bank of first, second, third and fourth memories and a second bank of first, second, third and fourth memories; and
        control means for controlling the memories of said banks during write operation such that state metrics of respective path metric sequences from said ACS circuits are stored into the first, second third and fourth memories of the first bank and state metrics of said respective sequences are subsequently stored into the first, second, third and fourth memories of the second bank,
        said control means controlling the memories of the first bank during read operation such that a first sequence of even-numbered state metric is read from the first memory, a second sequence of odd-numbered state metrics is read from the second memory, a third sequence of even-numbered state metrics is read from the third memory, and a fourth sequence of odd-numbered state metrics is read from the fourth memory, said first and second sequences forming state metrics of consecutive numbers of a first group, and said third and fourth sequences forming state metrics of consecutive numbers of a second group following the consecutive numbers of said first group,
        the state metrics read from the first and third memories of said first bank being supplied to a first group of said ACS circuits and the state metrics read from the second and fourth memories of said bank being supplied to a second group of said ACS circuits.

3. A Viterbi decoder for receiving a sequence of convolutional codewords, comprising:
    means for deriving a sequence of branch metrics from a received codeword sequence;
    means for dividing the branch metric sequence into a plurality of branch metric sequences;
    a plurality of add/compare/select (ACS) circuits for adding said branch metric sequences to a plurality of previous path metrics and determining therefrom a plurality of sequences of path metrics of maximum likelihood paths and plurality of indicators identifying the maximum likelihood paths;
    means for pipelining state metrics of said path metrics of said maximum likelihood paths and supplying the pipelined state metrics to said circuits as said previous path metrics; and
    means for receiving indicators form said ACS circuits and recovering therefrom an original bit sequence,
    wherein said pipelining means comprises:
        a cross-coupling switch for receiving sequences of the path metrics from said ACS circuits and interchanging alternate ones of state metrics between the path metric sequences;
        a first bank of first and second memories and a second bank of first and second memories;
        a plurality of selecting switches connected between the memories of said first and second banks and said ACS circuits; and
        control means for controlling the memories of said banks during write operation such that respective sequences of the state metrics from said cross-coupling switch are stored into the first and second memories of the first bank and said respective sequences of the state metrics from said cross-coupling switch are subsequently stored into the first and second memories of the second bank, said control means controlling the memories of said banks and said selecting switches during read operation such that a first sequence of even-numbered state metrics and a second sequence of odd-numbered state metrics are read from the first memory of the first bank and supplied via said selector switches to said ACS circuits, and a first sequence of odd-numbered state metrics and a second sequence of even-numbered state metrics are read from the second memory of the first bank and supplied via said selector switches to said ACS circuits, said first sequence of even-numbered state metrics and said first sequence of odd-numbered state metrics forming state metrics of consecutive numbers of a first group, and said second sequence of even-numbered state metrics and said second sequence of odd-numbered state metrics forming state metrics of consecutive numbers of a second group following the consecutive numbers of said first group.

4. A Viterbi decoder for receiving a sequence of convolutional codewords, comprising:

means for deriving a sequence of branch metrics from a received codeword sequence;

means for dividing the branch metric sequence into a plurality of branch metric sequences;

a plurality of add/compare/select (ACS) circuits for adding said branch metric sequences to a plurality of previous path metrics and determining therefrom a plurality of sequences of path metrics of maximum likelihood paths and plurality of indicators identifying the maximum likelihood paths;

means for pipelining state metrics of said path metrics of said maximum likelihood paths and supplying the pipelined state metrics to said circuits as said ACS previous path metrics; and means for receiving indicators form said ACS circuits and recovering therefrom an original bit sequence, wherein said pipelining means comprises;

a pair of cross-coupling switches for receiving respective sequences of the path metrics from said ACS circuits and interchanging alternate ones of state metrics between the path metric sequences;

a first bank of first, second, third and fourth memories and a second bank of first, second, third and fourth memories;

a plurality of selecting switches connected between said memories and said ACS circuits; and control means for controlling the memories of said banks during write operation such that respective sequences of the state metrics from said cross-coupling switches are stored into the first, second, third and froth memories of the first bank and said respective sequences of the state metrics from said cross-coupling switches are subsequently stored into the first, second, third and fourth memories of the second bank, said control means controlling the memories of the first bank and said selecting switches during read operation such that a first sequence of even-numbered state metrics is read from the first memory, a second sequence of odd-numbered state metrics is read from the second memory, a third sequence of even-numbered state metrics is read from the third memory, and a fourth sequence of odd-numbered state metrics is read from the fourth memory, said first and second sequences forming state metrics of consecutive numbers of a first group, and said third and fourth sequences forming state metrics of consecutive numbers of a second group following the consecutive numbers of said first group, the state metrics read from the first and third memories of said first bank being supplied via said selector switches to a first group of said ACS circuits and the state metrics read from the second and fourth memories of said first bank being supplied via said selector switches to a second group of said ACS circuits.

* * * * *